United States Patent
Chou et al.

(10) Patent No.: US 11,450,764 B2
(45) Date of Patent: Sep. 20, 2022

(54) SEMICONDUCTOR DEVICE AND METHOD OF FORMING THE SAME

(71) Applicant: Vanguard International Semiconductor Corporation, Hsinchu (TW)

(72) Inventors: Cheng-Wei Chou, Taoyuan (TW); Hsiu-Ming Wu, New Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/136,955

(22) Filed: Dec. 29, 2020

(65) Prior Publication Data
US 2022/0208992 A1  Jun. 30, 2022

(51) Int. Cl.
*H01L 29/778* (2006.01)
*H01L 29/66* (2006.01)

(52) U.S. Cl.
CPC ...... *H01L 29/778* (2013.01); *H01L 29/66462* (2013.01)

(58) Field of Classification Search
CPC ............. H01L 29/778; H01L 29/66462; H01L 29/66431; H01L 21/022
See application file for complete search history.

(56) References Cited

U.S. PATENT DOCUMENTS

| | | | | |
|---|---|---|---|---|
| 8,288,260 B1 * | 10/2012 | Hanson | ............. | H01L 29/42316 257/E31.127 |
| 2013/0252386 A1 * | 9/2013 | Sheppard | ............. | H01L 29/802 438/172 |
| 2015/0311084 A1 * | 10/2015 | Moore | ............. | H01L 29/42316 438/572 |
| 2017/0271492 A1 * | 9/2017 | Chiu | ............. | H01L 29/7784 |
| 2017/0317202 A1 * | 11/2017 | Green | ............. | H01L 29/1029 |
| 2017/0358647 A1 | 12/2017 | Moens et al. | | |
| 2021/0320196 A1 * | 10/2021 | Chou | ............. | H01L 29/7786 |

FOREIGN PATENT DOCUMENTS

| | | | |
|---|---|---|---|
| CN | 107424919 A | * | 12/2017 |
| TW | 201830525 A | | 8/2018 |
| TW | 202010130 A | * | 3/2020 |
| TW | 202015241 A | | 4/2020 |

* cited by examiner

*Primary Examiner* — Joseph C. Nicely
(74) *Attorney, Agent, or Firm* — Birch, Stewart, Kolasch & Birch, LLP

(57) ABSTRACT

A method of forming a semiconductor device includes: providing a substrate, wherein a buffer layer, a channel layer, and a barrier layer are sequentially formed on the substrate; forming a doped compound semiconductor layer on a portion of the barrier layer; forming a first etch stop layer on the doped compound semiconductor layer; forming a second etch stop layer on the first etch stop layer; forming a first dielectric layer on the second etch stop layer; forming an etch protection layer on the first dielectric layer; performing a first etch process to form a recess in the first dielectric layer; performing a second etch process to form an opening exposing a portion of the second etch stop layer; performing a removal process to remove remaining portions of the etch protection layer on the first dielectric layer; and forming a gate metal layer to fill the opening.

20 Claims, 6 Drawing Sheets

SEMICONDUCTOR DEVICE AND METHOD OF FORMING THE SAME

BACKGROUND

Field of the Disclosure

The present disclosure relates to a semiconductor device, and in particular to a semiconductor device with a doped compound semiconductor and a method of forming the same.

Description of the Related Art

Gallium nitride-based (GaN-based) semiconductor materials have many excellent characteristics, such as a high thermal resistance, a wide band-gap, and a high electron saturation rate. Accordingly, GaN-based semiconductor materials can be applied to high-speed and high-temperature operating environments. Recently, GaN-based semiconductor materials have been widely used in light-emitting diode (LED) elements and high-frequency elements, such as high electron mobility transistors (HEMTs) with structures of heterogeneous interfaces.

HEMTs may be adversely affected by a process (e.g. etch process) in manufacturing, resulting in worse electrical performance or uniformity. Although existing HEMTs are generally adequate for their intended purpose, they are not satisfactory in all respects.

SUMMARY

Some embodiments of the present disclosure provide a method of forming a semiconductor device, which includes providing a substrate, wherein a buffer layer, a channel layer, and a barrier layer are sequentially formed on the substrate; forming a doped compound semiconductor layer on a portion of the barrier layer; forming a first etch stop layer on the doped compound semiconductor layer, forming a second etch stop layer on the first etch stop layer; forming a first dielectric layer on the second etch stop layer, wherein the first dielectric layer covers a portion of the doped compound semiconductor layer and covers the barrier layer exposed by the doped compound semiconductor layer; forming an etch protection layer on the first dielectric layer; performing a first etch process which etches through the etch protection layer and partially through the first dielectric layer to form a recess in the first dielectric layer; performing a second etch process which etches the first dielectric layer under the recess to form an opening exposing a portion of the second etch stop layer, wherein the etch protection layer protects the first dielectric layer underlying the etch protection layer from being etched during the second etch process; performing a removal process to remove remaining portions of the etch protection layer on the first dielectric layer; and forming a gate metal layer to fill the opening.

Some embodiments of the present disclosure provide a semiconductor device, which includes a substrate, a buffer layer, a channel layer, a barrier layer, a doped compound semiconductor, a first etch stop layer, a second etch stop layer, a first dielectric layer, and a gate metal layer. The buffer layer is disposed on the substrate, the channel layer is disposed on the buffer layer, and the barrier layer is disposed on the channel layer. The doped compound semiconductor is disposed on a portion of the barrier layer. The first etch stop layer is disposed on the doped compound semiconductor layer. The second etch stop layer is disposed on the first etch stop layer. The first dielectric layer is disposed on the second etch stop layer, wherein the first dielectric layer covers a portion of the doped compound semiconductor layer and covers the barrier layer exposed by the doped compound semiconductor layer. The gate metal layer is disposed on a portion of the second etch stop layer.

BRIEF DESCRIPTION OF THE DRAWINGS

The embodiments of the disclosure can be more fully understood by reading the subsequent detailed description and examples with references made to the accompanying drawings. In accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
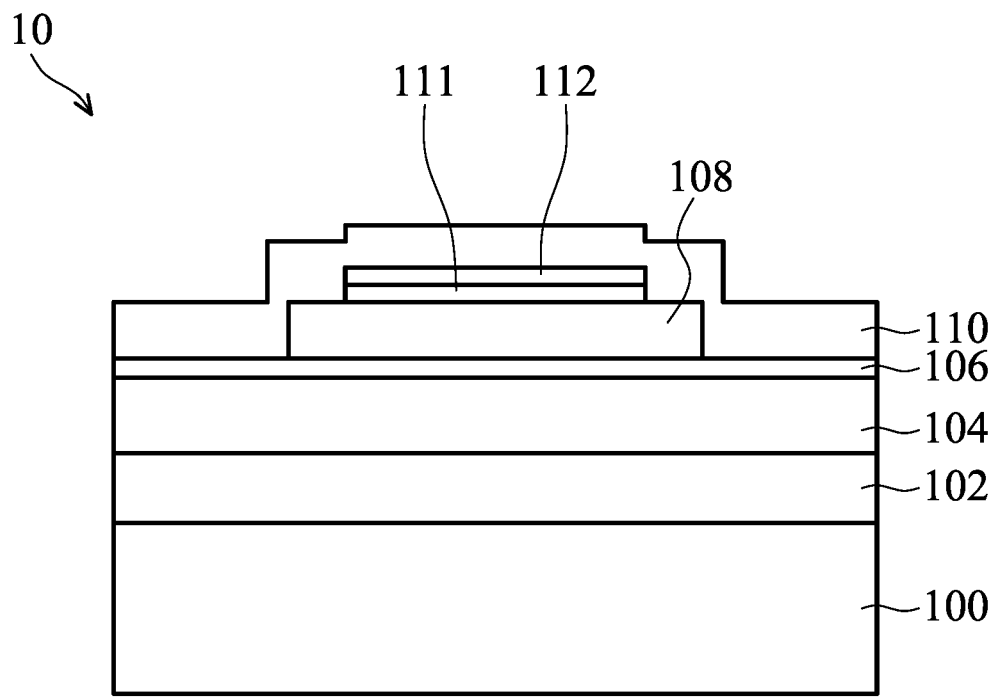
FIGS. 1-8 illustrate cross-sectional views of a semiconductor device during processes, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Additionally, in some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments, unless expressly described otherwise.

Further, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about", "approximately", and "roughly" typically mean±20% of the stated value, or ±10% of the stated value, or ±5% of the stated value, or ±3% of the stated value, or ±2% of the stated value, or ±1% of the stated value, or ±0.5% of the stated value. For example. "about 5 nm" may include a dimension range from 4.5 nm to 5.5 nm. The stated value of the present disclosure is an approximate value. When there is no specific description, the stated value includes the meaning of "about", "approximately", and "roughly".

Some embodiments of the disclosure are described below. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

The embodiment of the present disclosure provides a method for forming a semiconductor device. An etch protection layer is formed on a dielectric layer to reduce damage to the device caused by an etch process and further avoid short-circuits in the device. In addition, the semiconductor device provided by the embodiments of the present disclosure has an etch stop layer. The etch stop layer may be used to determine when to stop the etch process and protect other features, and may be configured according to requirements of different designs as well.

FIGS. 1-8 illustrate cross-sectional views of a semiconductor device during processes, in accordance with some embodiments of the present disclosure. Referring to FIG. 1, a substrate 100 is provided, and a buffer layer 102, a channel layer 104, and a barrier layer 106 are sequentially formed on the substrate 100. The substrate 100 may include an elemental semiconductor including Si or Ge; a compound semiconductors including GaAs, GaP, InP, InAs and/or InSb; an alloy semiconductor including SiGe. GaAsP, AlInAs, AlGaAs, GaInAs, GaInP, and/or GaInAsP, or a combination thereof.

In some embodiments, the substrate 100 may be a semiconductor-on-insulator substrate, such as a silicon-on-insulator substrate or a silicon germanium-on-insulator (SGOI) substrate. In other embodiments, the substrate 100 may be a ceramic substrate, for example, AlN substrate, SiC substrate, $Al_2O_3$ substrate (also referred to as a sapphire substrate), a glass substrate, or another substrate. In some embodiments, the substrate 100 may include a ceramic substrate and a pair of blocking layers disposed on the upper and lower surfaces of the ceramic substrate respectively. The ceramic substrate may include a ceramic material, which includes an inorganic metal material. For example, the ceramic substrate may include SiC, AlN, sapphire, or another suitable material. The sapphire substrate may be alumina.

The crystal lattice and the coefficient of thermal expansion of the substrate 100 may be different from those of the features (For example, the channel layer 104) above the substrate 100, so strains may occur at or near the interface between the substrate 100 and the features above the substrate 100, resulting in defects such as cracks or warpage. As shown in FIG. 1, the buffer layer 102 may be formed on the substrate 100 to mitigate strains formed in the features (For example, the channel layer 104) above the substrate 100. The material of the buffer layer 102 may include AlN, GaN, $Al_xGa_{1-x}N$ (0<x<1), a combination thereof, or another material, and may be formed by an epitaxial growth process, such as metal organic chemical vapor deposition (MOCVD), hydride vapor phase epitaxy (HVPE), molecular beam epitaxy (MBE), a combination thereof, or the like. In some embodiments, the buffer layer 102 may be a multilayer structure (not shown). For example, the buffer layer 102 may include a superlattice buffer layer and/or a gradient buffer layer. The superlattice buffer layer may be disposed on the substrate 100 and the gradient buffer layer may be disposed on the superlattice buffer layer, which may effectively prevent dislocations in the substrate 100 from entering the features above substrate 100, and further improve crystallization quality of other overlying film and/or layers.

In some embodiments, an optional seed layer (not shown) may be formed between the substrate 100 and the buffer layer 102. In such embodiments, the seed layer may mitigate differences in crystal lattice between the substrate 100 and the overlying film and/or layers to improve crystallization quality. The material of the seed layer may include AlN, $Al_2O_3$, AlGaN, SiC, Al, a combination thereof, or the like. The seed layer with a single-layer structure or a multilayer structure may be formed by a suitable process, such as chemical vapor deposition (CVD), atomic layer deposition (ALD), physical vapor deposition (PVD), another process, or a combination thereof. In some embodiments, the material of the buffer layer 102 may be determined by the material of the seed layer and the inflow gas in the epitaxial growth process.

The channel layer 104 is formed on the buffer layer 102. In some embodiments, the material of the channel layer 104 may include a binary compound semiconductor of group III-V, such as a nitride of group III. For example, the material of the channel layer 104 may be GaN. In some embodiments, the channel layer 104 may be doped with n-type or p-type dopants. The channel layer may be formed by an epitaxial growth process, such as MOCVD, HVPE, MBE, a combination thereof, or the like. In some embodiments, the breakdown voltage of a HEMT mainly depends on the thickness of the GaN channel layer. For example, increasing the thickness of the GaN channel layer by 1 µm may increase the breakdown voltage of a HEMT by about 100 volts. During an epitaxial growth process for forming a GaN layer, a substrate with high thermal conductivity and high mechanical strength should be used to deposit GaN material thereon, otherwise the substrate may be warped or even cracked. Compared with the Si substrate, the AlN substrate has higher thermal conductivity and higher mechanical strength such that a thicker GaN layer may be formed on the AlN substrate.

The barrier layer 106 is formed on the channel layer 104. The material of the barrier layer 106 may include a ternary compound semiconductor of group III-V, such as a nitride of group M. For example, the material of the barrier layer may be AlGaN, AlInN, or a combination thereof. In other embodiments, the barrier layer 106 may include GaN, AlN. GaAs, GaInP, AlGaAs, InP, InAlAs, InGaAs, other suitable material of group III-V, or a combination thereof. In some embodiments, the barrier layer 106 may be doped with, for example, n-type or p-type dopants. The barrier layer may be formed by an epitaxial growth process, such as MOCVD. HVPE, MBE, a combination thereof or a similar process. According to some embodiments of the present disclosure, the material of the channel layer 104 is different from that of the barrier layer 106, and thereby the interface between the channel layer 104 and the barrier layer 106 is a heterojunction structure. The lattice mismatch between the channel layer 104 and barrier layer 106 may result in stress that leads to piezoelectric polarization effect. Besides, the ionicity of the bonding between the metal of group III (e.g. Al, Ga, or In) and nitrogen is relatively strong, resulting in spontaneous polarization. Due to the difference in energy gap between the channel layer 104 and the barrier layer 106, the piezoelectric polarization and spontaneous polarization described above, two-dimensional electron gas (2DEG) (not shown) is formed at the heterogeneous interface between the channel layer 104 and the barrier layer 106. In some embodiments of the present disclosure, some semiconductor devices are HEMTs using 2DEG as conductive carriers.

The doped compound semiconductor layer 108 is formed on the barrier layer 106. According to some embodiments of the present disclosure, the material of the doped compound semiconductor layer 108 may include a doped compound semiconductor material, such as GaN doped with p-type or n-type dopants. The steps for forming the doped compound semiconductor layer 108 may include depositing a doped compound semiconductor material layer on the barrier layer 106 thorough an epitaxial growth process, forming a patterned mask layer on the doped compound semiconductor material layer, performing an etching process on the doped compound semiconductor material layer to remove portions of the doped compound semiconductor material layer not covered by the patterned mask layer, and removing the patterned mask layer. The patterned mask layer may be hard mask or photoresist. In some embodiments, the doped compound semiconductor material layer may be in-situ deposited in the same deposition chamber where the seed layer (optional), the buffer layer 102, the channel layer 104, and the barrier layer 106 are deposited. The doped compound semiconductor layer 108 may have a rectangular cross-section as shown in FIG. 1. In other embodiments, the doped compound semiconductor layer 108 may have a cross-section of another shape, such as a trapezoidal shape.

Referring to FIG. 1, the first etch stop layer 111 is formed on the doped compound semiconductor layer 108. The material of the first etch stop layer 111 may include nitride, such as silicon nitride, silicon oxynitride, silicon carbonitride, silicon oxycarbonitride, gallium nitride, aluminum nitride, metal nitride, metal silicide nitride, or a combination thereof. The metal nitride may include, for example, titanium nitride, molybdenum nitride, tungsten nitride, tantalum nitride, tantalum silicon nitride, titanium aluminum nitride, another suitable material, or a combination thereof. The steps for forming the first etch stop layer 111 may include depositing and patterning an etch stop material layer. For example, the deposition process may include CVD, ALD, or PVD (e.g. sputtering or evaporation), another suitable process, or a combination thereof. In some embodiments, in the subsequent processes, the first etch stop layer 111 may protect the doped compound semiconductor layer 108 under the first etch stop layer 111 to obviate or prevent the electrical uniformity of the semiconductor device from becoming worse under the impact of the etchant (such as plasma) used in the etch process or the gases in the environment. The thickness of the first etch stop layer 111 may be about 100 Å to 1000 Å, for example, 300 Å. The second etch stop layer 112 is formed on the first etch stop layer 111, as shown in FIG. 1. The second etch stop layer 112 may be used as an etch stop layer and protect the first etch stop layer 111 in subsequent etch processes to avoid having an impact on the threshold voltage of the device due to the damage to the first etch stop layer 111 caused by the etchant. The material of the second etch stop layer 112 is different from that of the first etch stop layer 111. For example, the material of the second etch stop layer 112 may include doped or undoped silicon, silicon oxide, silicon carbide, silicon nitride, silicon oxynitride, silicon carbonitride, silicon oxycarbide, silicon oxycarbonitride, metal silicide, tetraethoxysilane (TEOS) oxide, phosphosilicate glass (PSG), borophosphosilicate glass (BPSG), a low-k dielectric material (dielectric constant less than four), another suitable material, or a combination thereof.

The second etch stop layer 112 may be form by depositing and patterning an etch stop material layer. The second etch stop layer 112 may have a thickness of about 2 nm to about 50 nm, for example, it may be between 10 nm and 20 nm. The deposition process includes CVD, PVD, ALD, high-density plasma chemical vapor deposition (HDPCVD), MOCVD, remote plasma chemical vapor deposition (RPCVD), plasma enhanced chemical vapor deposition (PECVD), plating, another suitable method, or a combination thereof. In some embodiments, the second etch stop layer 112 and the first etch stop layer 111 may protect the doped compound semiconductor layer 108 to obviate or prevent the electrical uniformity of the semiconductor device from becoming worse under the impact of the etch processes.

In one particular embodiment, the first etch stop layer 111 includes titanium nitride and the second etch stop layer 112 includes doped or undoped silicon. The first etch stop layer 111 containing titanium nitride and the doped compound semiconductor layer 108 may form a Schottky barrier such that the threshold voltage may increase. In this embodiment, in addition to protecting the doped compound semiconductor layer 108 from being affected by subsequent processes, the second etch stop layer 112 may be doped or undoped polycrystalline silicon according to the application and design of the product. The widths of the first etch stop layer 111 and the second etch stop layer 112 are substantially the same as the width of the doped compound semiconductor layer 108. In one embodiment, the widths of the first etch stop layer 111 and the second etch stop layer 112 may be different from the width of the doped compound semiconductor layer 108.

As shown in FIG. 1, a dielectric layer 110 is formed on the second etch stop layer 112, and the dielectric layer 110 covers a portion of the doped compound semiconductor layer 108 and covers the barrier layer 106 exposed by the doped compound semiconductor layer 108. The dielectric layer 110 may include a single-layer or a multilayer dielectric material, such as silicon oxide, silicon nitride, silicon oxynitride, tetraethoxysilane (TEOS) oxide, phosphosilicate glass (PSG), borophosphosilicate glass (BPSG), a low-k dielectric material, and/or another suitable dielectric material. The low-k dielectric material may include but not limited to fluorinated silica glass (FSG), hydrogen silsesquioxane (HSQ), carbon-doped silicon oxide, amorphous fluorinated carbon, parylene, bis-benzocyclobutenes (BCB), or polyimide. The dielectric layer 110 may be formed by a deposition process, for example, spin coating. CND, ALD, HDPCVD, another suitable process, or a combination thereof.

Figure 2:
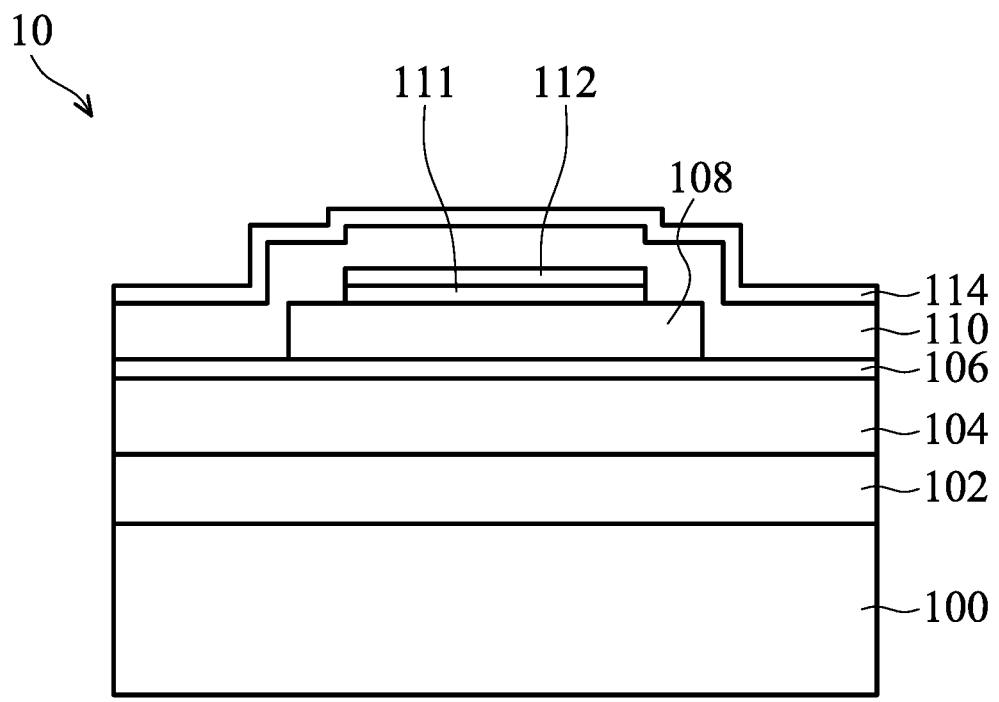

Referring to FIG. 2, an etch protection layer 114 is formed on the dielectric layer 110. The material of the etch protection layer 114 includes silicon nitride, titanium nitride, other suitable materials, or a combination thereof, and may be formed by a deposition process, for example, CND, ALD, or PVD (e.g. sputtering or evaporation), another suitable process, or a combination thereof. In other embodiments, the etch protection layer 114 may be a photoresist material. The etch protection layer 114 may have a thickness ranging from about 100 Å to about 1000 Å, for example, 300 Å. In some embodiments, the etch protection layer 114 may protect the dielectric layer 110 under the etch protection layer 114 during the subsequent etch process to avoid defects generating in the dielectric layer 110 and to ensure the aspect ratio of the opening 116O subsequently formed.

Figure 3:
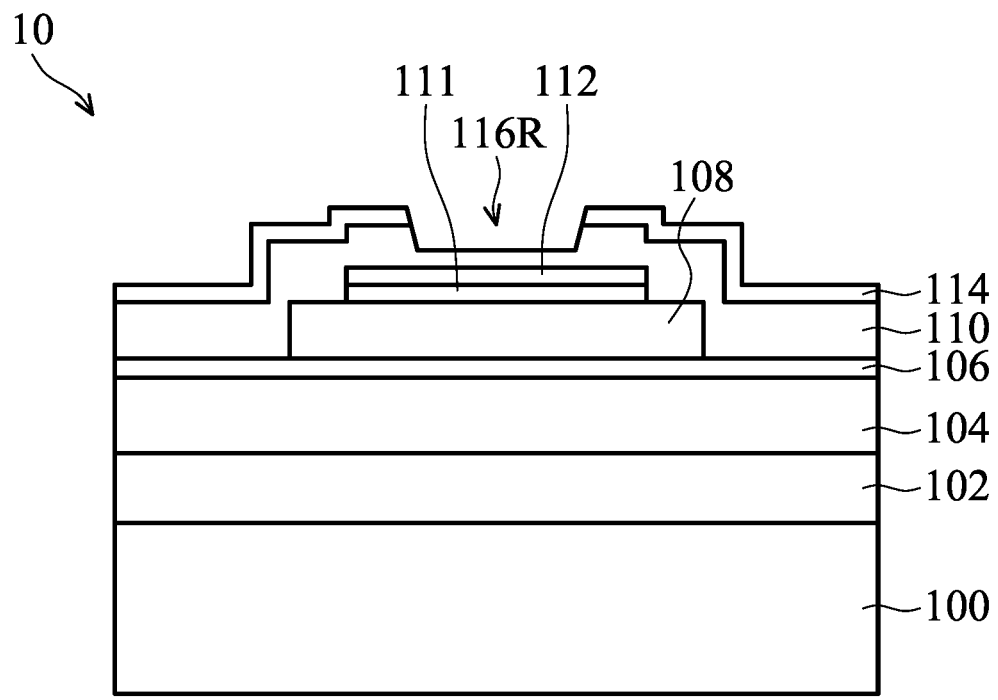

Referring to FIG. 3, a first etch process is performed to etch through the etch protection layer 114 and partially through the dielectric layer 110, thereby forming a recess 116R in the dielectric layer 110. The position of the recess 116R corresponds to where a gate metal layer is to be formed subsequently. Specifically, the first etch process etches through the protection layer 114 over the second etch stop layer 112 but does not completely etch through the dielectric layer 110 over the second etch stop layer 112 so that a portion of the dielectric layer 110 remains beneath the recess 116R. In some embodiments, after the first etch process, a thickness of the remaining portion of the dielectric layer 110 beneath the bottom surface of the recess 116R is between about 300 Å to 1000 Å, for example, about 300 Å. In these embodiments, the dielectric layer 110 over the second etch stop layer 112 is not completely removed, which may prevent adverse effects on features below the dielectric layer 110 caused by the etchant in the first etch process. According to some embodiments of the present disclosure, as the material of the etch protection layer 114 includes silicon nitride or titanium nitride and the material of the dielectric layer 110 includes silicon oxide, the first etch process is a dry etch process using an etchant including plasma containing Ar or F gas, but the embodiments of the present disclosure are not limited thereto. In other embodiments, the material of the etch protection layer 114 includes organic material, such as a photoresist, spin-on glass (SOG), resin, polyimide. In one embodiment, the material of the etch protection layer 114 includes inorganic material, for example, titanium nitride, tetraethoxysilane (TEOS) oxide, phosphosilicate glass (PSG), borophosphosilicate glass (BPSG), a low-k dielectric material (dielectric constant less than four), silicon, silicon oxide, silicon nitride, silicon carbide, silicon oxynitride, silicon carbonitride, silicon oxycarbide, silicon oxycarbonitride, metal silicide, another suitable dielectric material, or a combination thereof.

As the material of the dielectric layer 110 includes silicon oxide, the first etch process may be a wet etch process using an etchant including hydrofluoric acid (HF) or buffered oxide etchant (BOE), but the embodiments of the present disclosure are not limited thereto.

Figure 4:
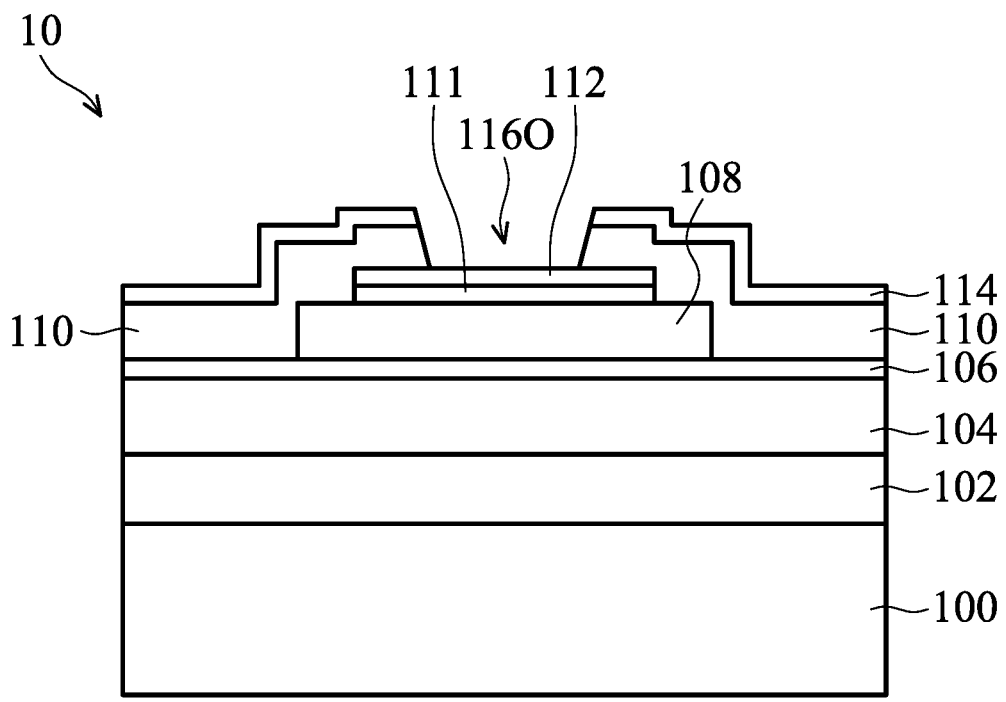

Referring to FIG. 4, a second etch process is performed to remove the dielectric layer 110 under the recess 116R such that an opening 116O is formed and the second etch stop layer 112 is exposed. According to some embodiments of the present disclosure, when the material of the dielectric layer 110 includes silicon oxide, the second etch process is preferably a wet etch process using an etchant containing a buffered oxide etchant (BOE). During the second etch process, the etch protection layer 114 protects the dielectric layer 110 beneath the etch protection layer 114 from etch. This may avoid defects generating in the dielectric layer 110 and prevent defects (if present) in the dielectric layer 110 from being expanded. The second etch stop layer 112 may protect the doped compound semiconductor layer 108 during etch processes.

In the deposition process of forming the dielectric layer 110, due to the topography of the second etch stop layer 112 and the conformal deposition of the dielectric layer 110 on the second etch stop layer 112, the edges or corners of the dielectric layer 110 may result in defects (such as seams) generating therein. In conventional processes, an etch process may also result in defects that generate in the dielectric layer, or the etchant may enter the seams in the dielectric layers and expand the seams. As a result, when a gate metal is subsequently deposited, the gate metal may be filled into the seams in the dielectric layer, causing short-circuits (e.g. a gate-to-drain short-circuit) in the device. Embodiments of the present disclosure provide a method for forming a semiconductor device, including forming the etch protection layer 114 on the dielectric layer 110 to protect the dielectric layer 110 and avoid the formation of defects in the dielectric layer 110 or the expansion of defects in the dielectric layer 110 during the etch processes, thereby preventing short-circuits in the device.

Figure 5:
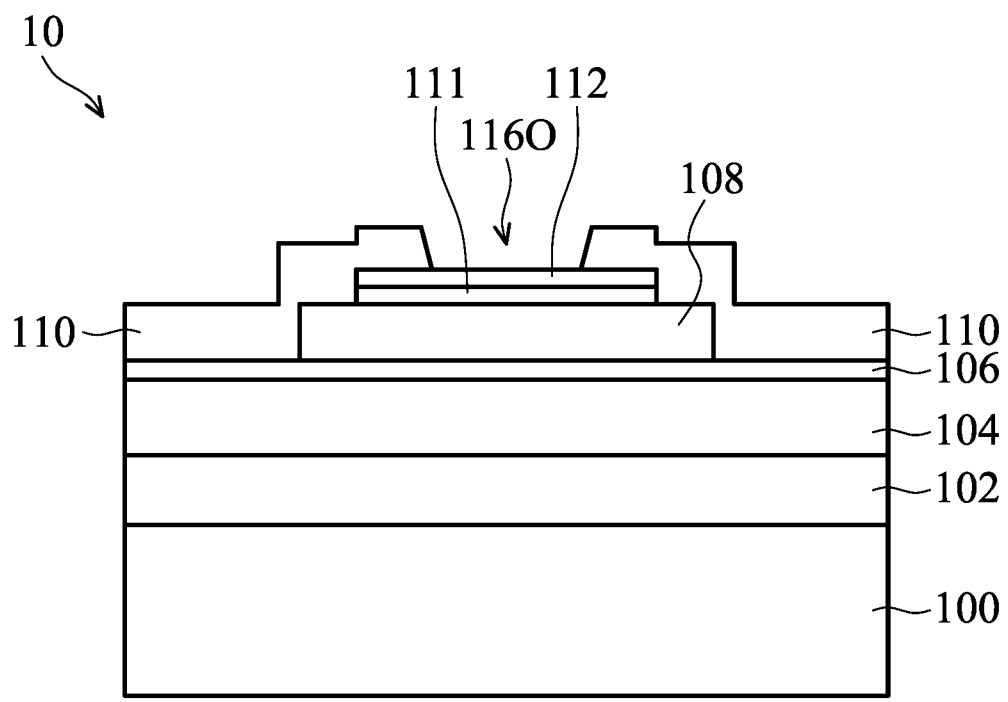

Referring to FIG. 5, a removal process is performed to remove the portions of the etching protection layer 114 that remain on the dielectric layer 110. In the removal process, the second etch stop layer 112 may protect the first etch stop layer 111 and the doped compound semiconductor layer 108 below the second etch stop layer 112. For example, when the etch protection layer 114 and the first etch stop layer 111 include the same material and the second etch stop layer 112 is different from the first etch stop layer 111, the second etch stop layer 112 may protect the first etch stop layer 111 from being etched during the removal process. In some embodiments, as the material of the etch protection layer 114 includes silicon nitride or titanium nitride, the removal process includes a wet etch process using an etchant containing an acid (such as hydrochloric acid or sulfuric acid) along with hydrogen peroxide, but the embodiments of the present disclosure are not limited thereto.

Figure 6:
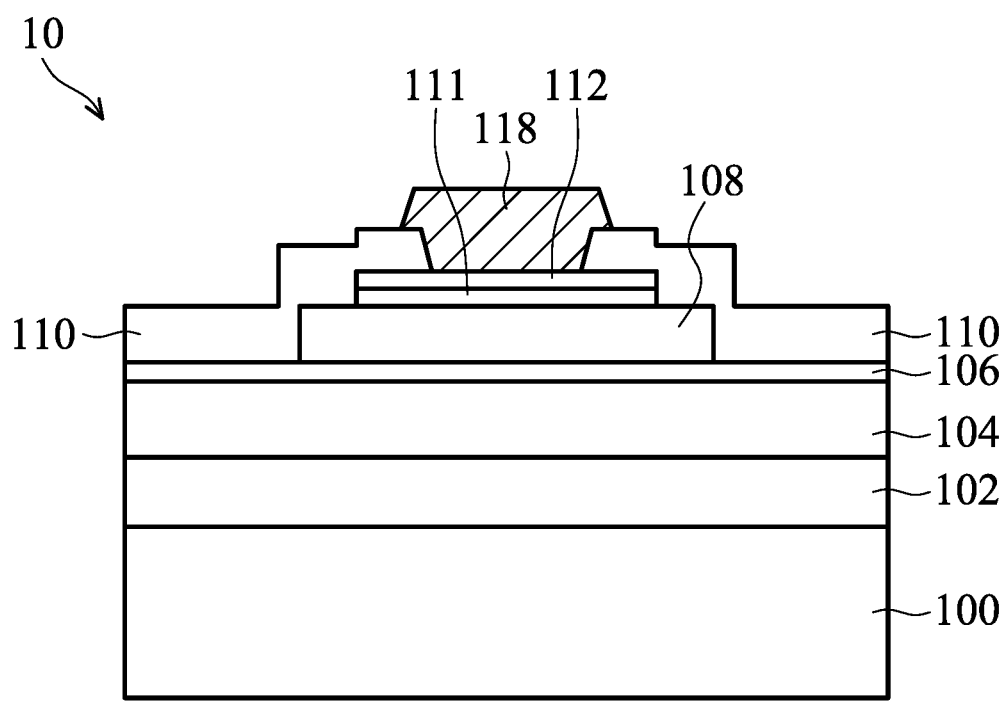

Referring to FIG. 6, a gate metal layer 118 is formed to fill the opening 116O. The material of the metal layer 118 may include metal, metal nitride, metal oxide, metal alloy, another suitable conductive material, a combination thereof, or a multilayer structure thereof. For example, the metal may include Au, Ni, Pt, Pd, Ir, Ti, Cr, W, Al, Cu, or the like; the metal nitride may include MoN, WN, TiN, TaN, TaSiN, TaCN, TiAlN, or the like; the metal nitride may include MoN, WN, TiN, TaN, TaSiN, TaCN, TiAlN, or the like. In other embodiments, the conductive material of the gate metal layer 118 may include NiSi, CoSi, TaC, TiAl, or the like. A layer of the above material may be formed by, for example, CVD, ALD, PVD (such as sputtering or evaporation), and then the layer is patterned to form the gate metal layer 118.

Figure 7:
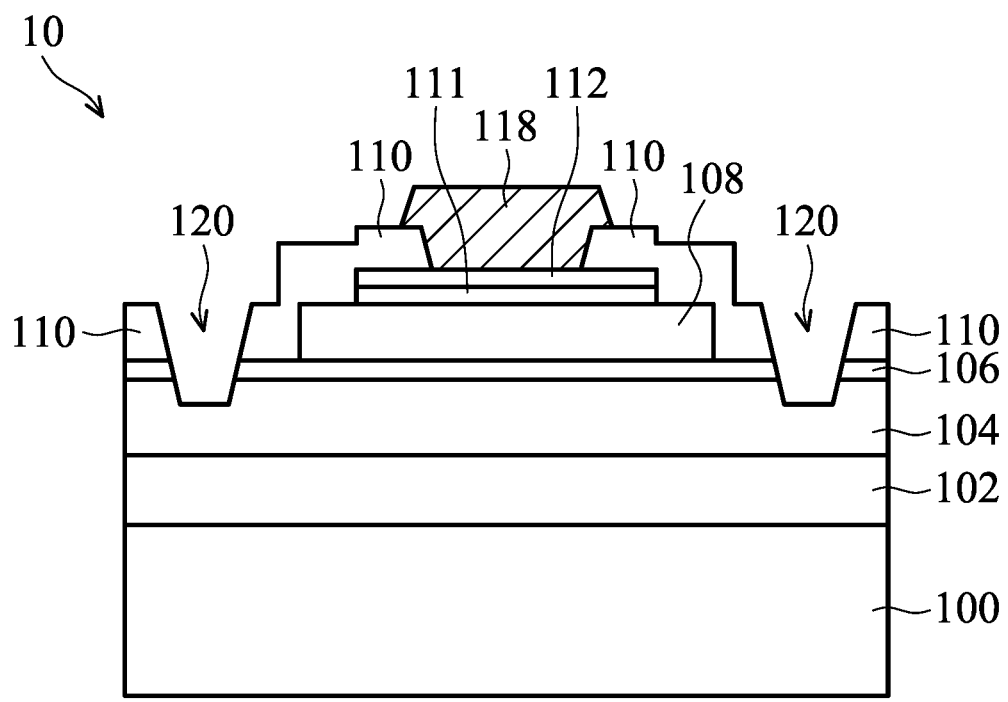
Figure 8:
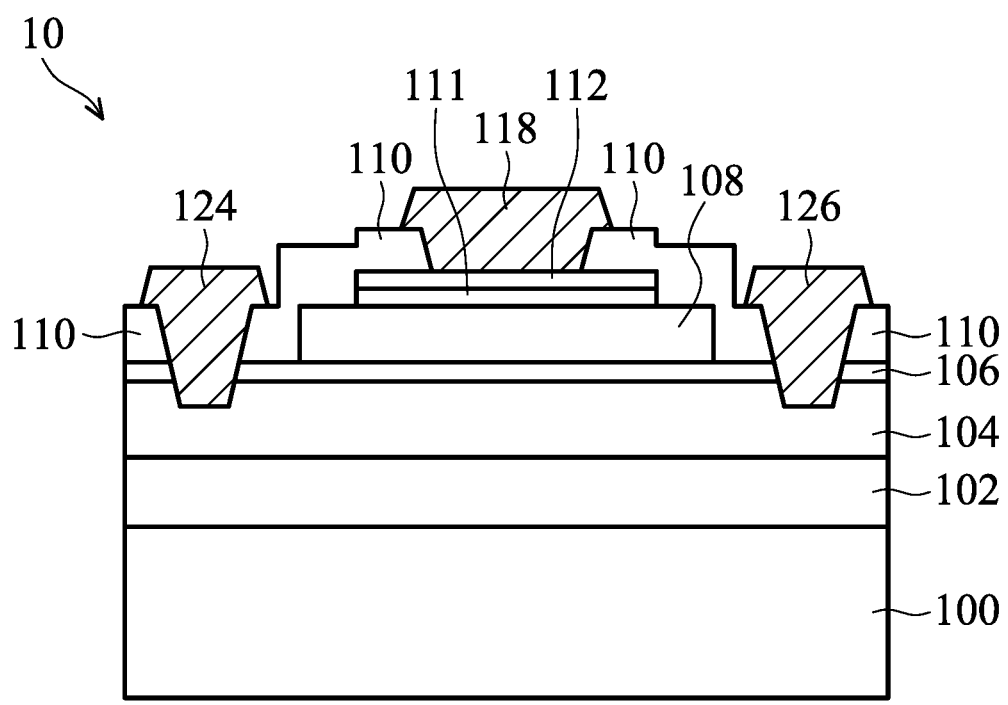

Referring to FIGS. 7 and 8, after the removal process, a source/drain structure 124/126 may be formed on opposite sides of the doped compound semiconductor 108. In some embodiments, the method for forming the source/drain structure 124/126 includes performing a patterning process to form a pair of openings 120 (or more openings) extending through the dielectric layer 110 and the barrier layer 106 into the channel layer 104, depositing a conductive material layer in the openings 120, and patterning the conductive material layer to form the source/drain structure 124/126. The material of the conductive layer may include the material of the gate metal layer 118 described above, a combination thereof, or a multilayer structure thereof. In other embodiments, the material of source/drain structure 124/126 may include NiSi, CoSi, TaC, TaSiN, TaCN, TiAl, TiAlN, metal oxide, metal alloy, another suitable conductive material, a combination thereof, or a multilayer structure thereof. In some embodiments, the source/drain structure 124/126 may include a material the same as or similar to that of the gate metal layer 118, and it may be formed in the same process or in different processes.

Figure 9:
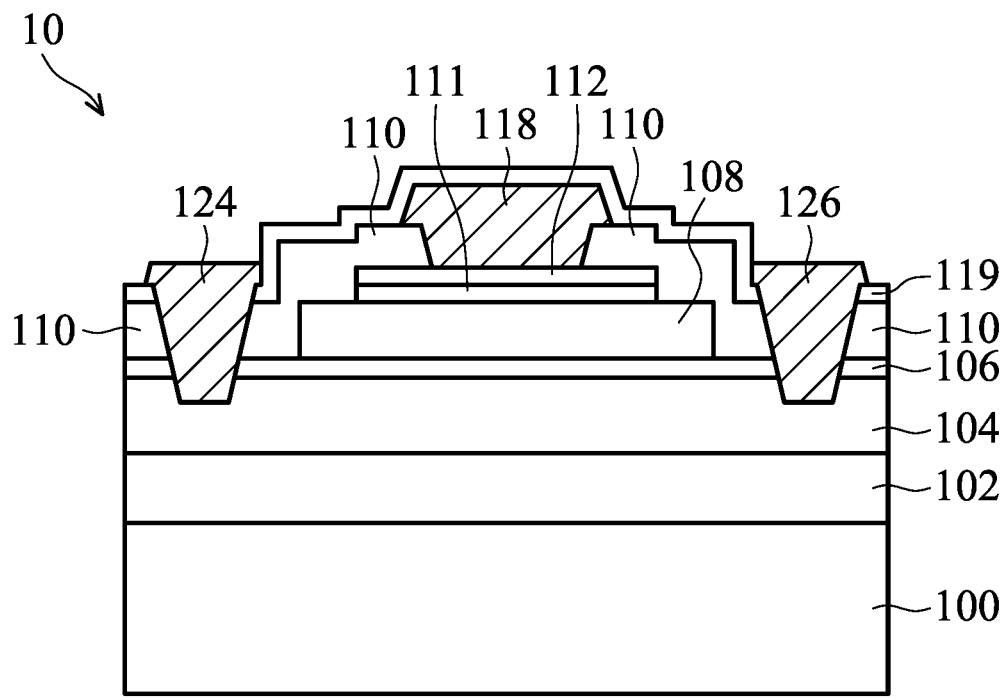
FIG. 9 illustrates a cross-sectional view of a semiconductor device during processes, in accordance with another embodiment of the present disclosure.

As shown in FIG. 9, in another embodiment, a dielectric layer 119 is formed on the dielectric layer 110 and the gate metal layer 118. The openings 120 extend through the dielectric layer 119, the dielectric layer 110, and the barrier layer 106 into the channel layer 104. The source/drain structure 124/126 is formed on the dielectric layer 119 and filled into the openings 120. In this embodiment, the gate metal layer 118 and the source/drain structure 124/126 are formed in different steps.

Figure 10:
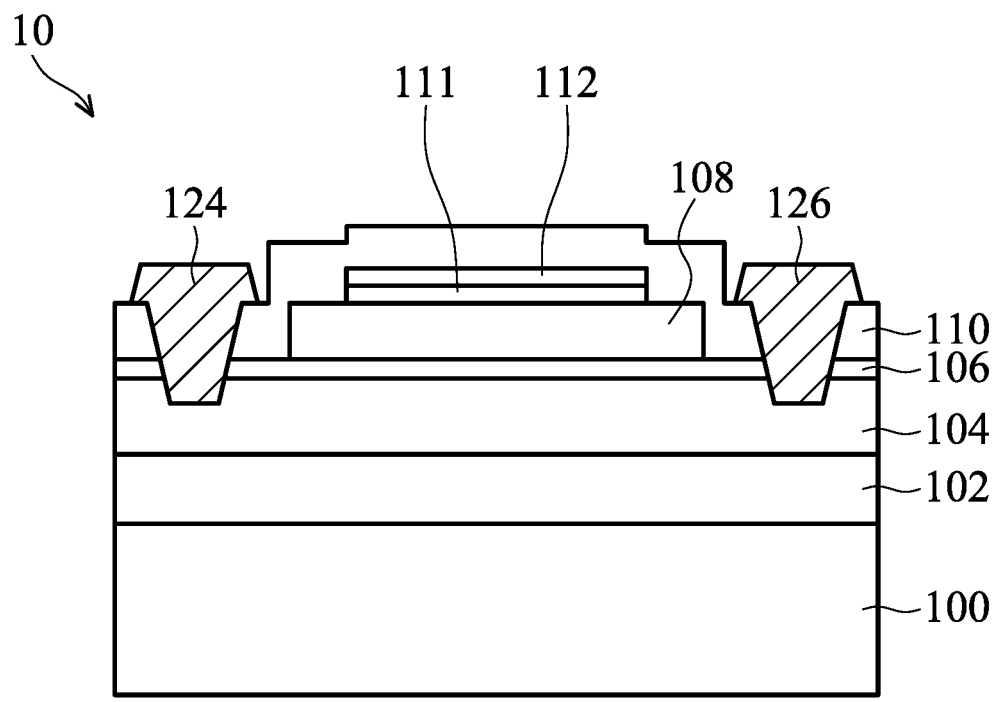
FIGS. 10-11 illustrate cross-sectional views of a semiconductor device during processes, in accordance with other embodiments of the present disclosure.
Figure 11:
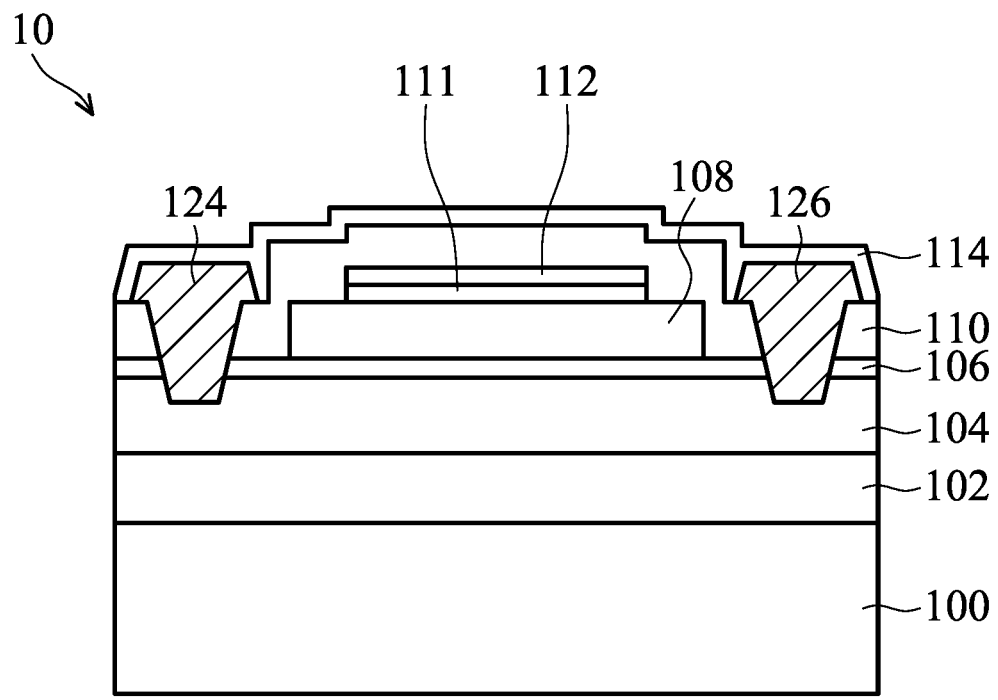

In other embodiments, the source/drain structure 126 may be formed on opposite sides of the doped compound semiconductor layer 108 after the dielectric layer 110 is formed on the second etch stop layer 112 and before the removal process is performed. For example, referring to FIG. 10, the source/drain structure 126 may be formed after the dielectric layer 110 is formed on the second etch stop layer 112 and before the etch protection layer 114 is formed on the dielectric layer 110. The source/drain structure 124/126 may be formed by a method including performing a patterning process to form a pair of openings (or more openings) extending through the dielectric layer 110 and the barrier layer 106 into the channel layer 104, depositing a conductive material layer in the openings, and patterning the conductive material layer to form the source/drain structure 124/126. The material of the conductive material layer is the same as or similar to the material of the source/drain structure 124/126 described above. Next, as shown in FIG. 11, an etch protection layer 114 is formed on the dielectric layer 110 and the source/drain structure 124/126. In other embodiments, the etch protection layer 114 is formed on the dielectric layer 119 and the source/drain structure 124/126. Then, processes similar to those shown in FIGS. 3-6 may be performed to form the semiconductor device 10 as shown in FIG. 8. In these embodiments, the etch protection layer 114 may also protect the dielectric layer 110 and avoid short-circuits in the device, as discussed above.

Figure 12:
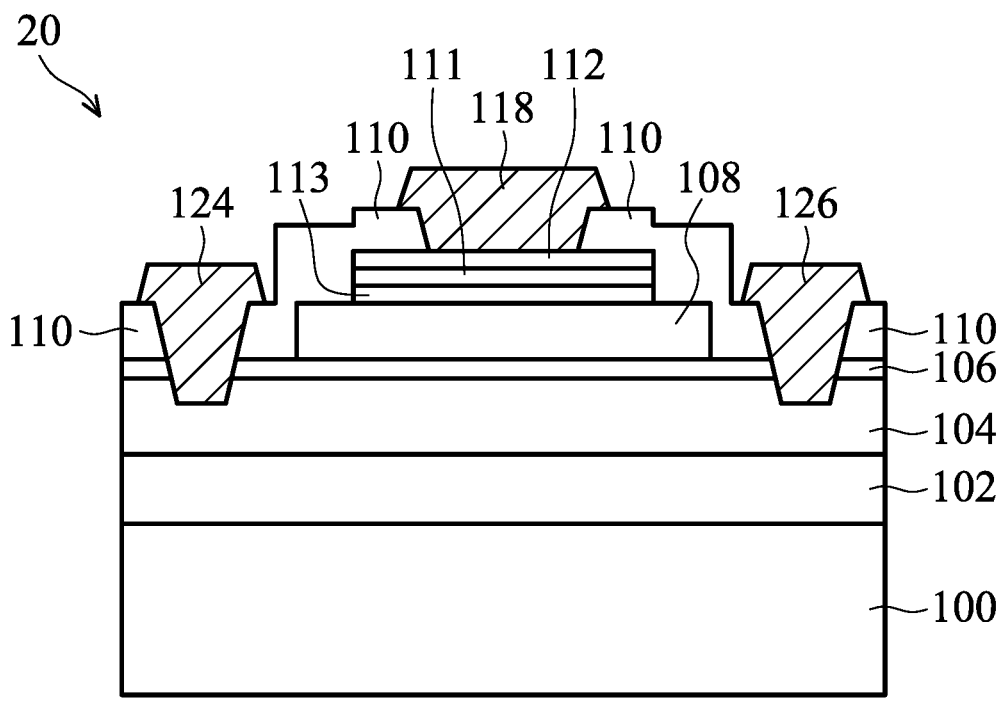
FIG. 12 illustrates a cross-sectional view of a semiconductor device during processes, in accordance with the other embodiment of the present disclosure.

Referring to FIG. 12, in comparison with the semiconductor device 10 shown in FIG. 8, the semiconductor device 20 further includes a third etch stop layer 113 between the doped compound semiconductor layer 108 and the first etch stop layer 111. In some embodiments, the material of the third etch stop layer 113 may be the same as or similar to the material of the second etch stop layer 112. The third etch stop layer 113 may be formed by a method similar to the method of forming the first etch stop layer 111 or the second etch stop layer 112 described above. The thickness of the third etch stop layer 113 may be about 2 nm to about 50 nm, for example, about 10 nm to 20 nm. In some embodiments of the present disclosure, the first etch stop layer 111 includes titanium nitride, and the second etch stop layer 112 and the third etch stop layer 113 include doped or undoped silicon that may be single-crystal, poly-crystal (polycrystalline), or amorphous. In such embodiments, in addition to the advantages of the first etch stop layer 111 and the second etch stop layer 112, the third etch stop layer 113 may be chosen as doped or undoped polycrystalline silicon depending on the desired threshold voltage. In further embodiments, the threshold voltage may be adjusted by varying the dopant concentration of the third etch stop layer 113.

In some embodiments where the doped compound semiconductor layer 108 is p-type, the activation rate of dopants may be low after the doping process, and unactivated dopants may result in charged defects in the doped compound semiconductor layer 108 and adversely affect the performance of the semiconductor device. In these embodiments, in addition to the advantages as described above and protecting the doped compound semiconductor layer 108 underlying the third etch stop layer 113 to avoid adverse effects caused by the subsequent processes, the undoped silicon in the third etch stop layer 113 may compensate the unactivated dopants to further improve the characteristics of the semiconductor device and allow the semiconductor device to provide a higher saturation current. Moreover, compared with the p-type doped compound semiconductor layer 108, the undoped silicon in the third etch stop layer 113 may be considered as n-type semiconductor material, so the undoped silicon in the third etch stop layer 113 may form an NP junction with the doped compound semiconductor layer 108. When the semiconductor device is in on-state, this NP junction provides a reverse bias, which may reduce the gate leakage in the semiconductor device and increase the breakdown voltage of the gate.

The method for forming a semiconductor device provided by the embodiments of the present disclosure includes forming an etch protection layer on the dielectric layer. During the etch process, the etch protection layer protects the dielectric layer to prevent the formation of defects or the expansion of seams in the dielectric layer, and avoid short-circuits in the device caused by filling a metal into the seams in the dielectric layer in the subsequent process, thereby improving the electrical performance of the device. The semiconductor device provided by the embodiments of the present disclosure may avoid damage to the device during manufacturing processes. For example, the impact on the features of the device caused by the etchant in the etch process may be reduced. Additionally, the configuration of the device can be adjusted according to the desired threshold voltage. In some embodiments, characteristics of the semiconductor device may be further improved and a higher saturation current may be achieved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate, a buffer layer on the substrate, a channel layer on the buffer layer, and a barrier layer on the channel layer;
   a doped compound semiconductor layer on a portion of the barrier layer;
   a first etch stop layer on the doped compound semiconductor layer;
   a second etch stop layer on the first etch stop layer;
   a first dielectric layer on the second etch stop layer, wherein the first dielectric layer exposes a portion of the second etch stop layer; and
   a gate metal layer on the portion of the second etch stop layer and not penetrating the second etch stop layer.

2. The semiconductor device as claimed in claim 1, further comprising a third etch stop layer between the doped compound semiconductor layer and the first etch stop layer.

3. The semiconductor device as claimed in claim 2, wherein a material of the third etch stop layer comprises doped or undoped silicon.

4. The semiconductor device as claimed in claim 1, wherein a material of the first etch stop layer comprises nitride, silicon nitride, silicon oxynitride, silicon carbonitride, silicon oxycarbonitride, metal nitride, gallium nitride, aluminum nitride, titanium nitride, molybdenum nitride, tungsten nitride, tantalum nitride, tantalum silicon nitride, titanium aluminum nitride, or a combination thereof.

5. The semiconductor device as claimed in claim 1, wherein a material of the second etch stop layer comprises doped or undoped silicon, silicon oxide, silicon carbide, silicon nitride, silicon oxynitride, silicon carbonitride, silicon oxycarbide, silicon oxycarbonitride, metal silicide, TEOS oxide, PSG, BPSG, a low-k dielectric material, or a combination thereof.

6. The semiconductor device as claimed in claim 1, further comprising a source/drain structure on opposite sides of the doped compound semiconductor layer, wherein the source/drain structure extends through the first dielectric layer and the barrier layer into the channel layer.

7. The semiconductor device as claimed in claim 1, further comprising a second dielectric layer on the first dielectric layer and the gate metal layer, and a source/drain structure on the second dielectric layer.

8. The semiconductor device as claimed in claim 7, wherein the source/drain structure extends through the first dielectric layer, the second dielectric layer, and the barrier layer into the channel layer.

9. The semiconductor device as claimed in claim 1, wherein the first dielectric layer have an opening exposing a portion of the second etch stop layer.

10. A method of forming the semiconductor device as set forth in claim 1, comprising:
    providing the substrate, wherein the buffer layer, the channel layer, and the barrier layer are sequentially formed on the substrate;
    forming the doped compound semiconductor layer on the portion of the barrier layer;
    forming the first etch stop layer on the doped compound semiconductor layer;
    forming the second etch stop layer on the first etch stop layer;
    forming the first dielectric layer on the second etch stop layer;
    forming an etch protection layer on the first dielectric layer;
    performing a first etch process which etches through the etch protection layer and partially through the first dielectric layer to form a recess in the first dielectric layer;
    performing a second etch process which etches the first dielectric layer under the recess to form an opening exposing the portion of the second etch stop layer, wherein the etch protection layer protects the first dielectric layer underlying the etch protection layer from being etched during the second etch process;
    performing a removal process to remove remaining portions of the etch protection layer on the first dielectric layer; and
    forming a gate metal layer to fill the opening, wherein the gate metal layer is on the portion of the second etch stop layer and not penetrating the second etch stop layer.

11. The method as claimed in claim 10, further comprising forming a third etch stop layer on the doped compound semiconductor layer before forming the first etch stop layer.

12. The method as claimed in claim 11, wherein a material of the third etch stop layer comprises doped or undoped silicon.

13. The method as claimed in claim 10, wherein a material of the first etch stop layer comprises nitride, silicon nitride, silicon oxynitride, silicon carbonitride, silicon oxycarbonitride, metal nitride, gallium nitride, aluminum nitride, titanium nitride, molybdenum nitride, tungsten nitride, tantalum nitride, tantalum silicon nitride, titanium aluminum nitride, or a combination thereof.

14. The method as claimed in claim 10, wherein a material of the second etch stop layer comprises silicon, oxide, silicon carbide, silicon nitride, silicon oxynitride, silicon carbonitride, silicon oxycarbide, silicon oxycarbonitride, metal silicide, tetraethoxysilane (TEOS) oxide, phosphosilicate glass (PSG), borophosphosilicate glass (BPSG), a low-k dielectric material (dielectric constant less than four), another suitable material, or a combination thereof.

15. The method as claimed in claim 10, wherein a material of the etch protection layer comprises organic material, inorganic material, photoresist, spin-on glass, resin, polyimide, tetraethoxysilane (TEOS) oxide, phosphosilicate glass (PSG), borophosphosilicate glass (BPSG), a low-k dielectric material, silicon, silicon oxide, silicon nitride, silicon carbide, silicon oxynitride, silicon carbonitride, silicon oxycarbide, silicon oxycarbonitride, metal silicide, titanium nitride, or a combination thereof.

16. The method as claimed in claim 10, further comprising forming a source/drain structure on opposite sides of the doped compound semiconductor layer after forming the first dielectric layer on the second etch stop layer and before performing the removal process.

17. The method as claimed in claim 10, wherein the first etch process is a dry etch process and the second etch process is a wet etch process.

18. The method as claimed in claim 10, wherein the first etch process and the second etch process are wet etch processes.

19. The method as claimed in claim 10, further comprising forming a source/drain structure on opposite sides of the doped compound semiconductor layer after performing the removal process.

20. The method as claimed in claim 10, further comprising forming a second dielectric layer on the gate metal layer and the first dielectric layer, and forming a source/drain structure on the second dielectric layer, wherein the source/drain structure extends through the first dielectric layer, the second dielectric layer, and the barrier layer into the channel layer.

* * * * *